United States Patent
Hind

(10) Patent No.: US 10,291,333 B2
(45) Date of Patent: May 14, 2019

(54) MEASUREMENT OF VOLTAGE STANDING WAVE RATIO OF ANTENNA SYSTEM

(71) Applicant: Telefonaktiebolaget LM Ericsson (publ), Stockholm (SE)

(72) Inventor: Krista Joleen Hind, Ottawa (CA)

(73) Assignee: Telfonaktiebolaget LM Ericsson (publ), Stockholm (SE)

( * ) Notice: Subject to any disclaimer, the term of this patent is extended or adjusted under 35 U.S.C. 154(b) by 265 days.

(21) Appl. No.: 15/287,536

(22) Filed: Oct. 6, 2016

(65) Prior Publication Data

US 2017/0026137 A1 Jan. 26, 2017

Related U.S. Application Data

(63) Continuation of application No. 13/424,101, filed on Mar. 19, 2012, now Pat. No. 9,482,705.

(51) Int. Cl.
| | |
|---|---|
| *H04B 17/10* | (2015.01) |
| *G01R 27/06* | (2006.01) |
| *G01R 29/10* | (2006.01) |
| *H04B 17/17* | (2015.01) |

(52) U.S. Cl.
CPC ........... *H04B 17/103* (2015.01); *G01R 27/06* (2013.01); *G01R 29/10* (2013.01); *H04B 17/17* (2015.01)

(58) Field of Classification Search
CPC ...... G01R 27/06; G01R 29/10; H04B 17/103; H04B 17/17
See application file for complete search history.

(56) References Cited

U.S. PATENT DOCUMENTS

| | | | |
|---|---|---|---|
| 4,630,228 | A | 12/1986 | Tarczy-Hornoch et al. |
| 5,408,690 | A | 4/1995 | Ishikawa et al. |
| 2003/0125893 | A1 | 7/2003 | Furse |
| 2005/0234662 | A1 | 10/2005 | Niedzwiecki et al. |
| 2006/0044182 | A1 | 3/2006 | Vacanti |
| 2009/0002213 | A1 | 1/2009 | LaMarche et al. |
| 2010/0321086 | A1 | 12/2010 | See et al. |
| 2011/0279192 | A1 | 11/2011 | Nash et al. |

OTHER PUBLICATIONS

Ericsson: "Design Specification VSWR Supervision", pp. 1-16, Dec. 23, 2011, 14/102 62-CNH 160 6510 Jen.
Ericsson: "Verification Specification for Test Method RUS and RRUS", pp. 1-252 Jun. 28, 2010, 64-CNH 160 5848.
Ericsson: "Digital VSWR-meter Phase 2 Technical Report", pp. 1-108, Jun. 28, 2011, 1/0363-25/FCP 103 4475 Jen.
Svante Lenke; "VSWR Implementation in Ericsson RUS and RRUS Products", Ericsson; PA3, May 21, 2011; Power Point.
Peter Rashev: "Narrow IF Bandwidth LMS-based DVSWR" Ericsson; May 24, 2011; pp. 1-4: Power Point.

*Primary Examiner* — Stephanie E Bloss
*Assistant Examiner* — Lisa E Peters
(74) *Attorney, Agent, or Firm* — Sage Patent Group

(57) ABSTRACT

The present invention provides methods and apparatus to detect the presence of interferers in a wideband digital VSWR measurement signal. Interferers cause power differences over different intervals of time and frequency, and may be detected by comparing the measured signals in both time and frequency domains with the original signal. Frequency components in the measured signals may be discarded if the interference is deemed too large. The remaining frequency components can then be used to compute the VSWR.

19 Claims, 5 Drawing Sheets

MEASUREMENT OF VOLTAGE STANDING WAVE RATIO OF ANTENNA SYSTEM

CROSS-REFERENCE TO RELATED APPLICATIONS

The present application is a continuation of U.S. application Ser. No. 13/424,101, filed Mar. 19, 2012, which is incorporated herein by reference in its entirety.

TECHNICAL FIELD

The present invention relates generally to measurement of the Voltage Standing Wave Ratio (VSWR) of antenna systems and, more particularly, to measurement techniques to reduce the impact of interfering signals in the calculation of the VSWR.

BACKGROUND

Traditionally, the Voltage Standing Wave Ratio (VSWR) of antenna systems is measured using filtered or narrowband power measurements. By measuring the power of the forward and reflected signals ($P_{fwd}$ and $P_{refl}$) simultaneously, the scalar return loss (RL) and reflection co-efficient ($\Gamma$) can be calculated.

Typical VSWR measurement systems consist of a directional coupler, and analog power detectors to measure the voltage of the forward signal, denoted $V_{fwd}$, and the voltage of the reflected signal, denoted $V_{refl}$. A mixer circuit and low pass filter are used to measure the VSWR over a specific frequency and bandwidth. An analog to digital converter (ADC) quantizes the power detector value. High values of $V_{refl}$ relative to $V_{fwd}$ indicate potential transmission line and antenna faults. Both $V_{refl}$ and $V_{fwd}$ will be affected if there is an interference signal coupled into the measurement within or even adjacent to the measurement bandwidth.

The current analog VSWR (AVSWR) and narrowband digital VSWR (DVSWR) measurement systems are unable to detect or account for interferers as they have no knowledge of the dynamic interferer. False alarms can be raised if the interference is large enough to raise the $V_{refl}$ such that it looks like a cable fault. False alarms may cause outages in the network if the transmission signal is turned off by fault management software to prevent damage to the radio in the event of a cable fault. False alarms also may cause unnecessary maintenance on the radio and antenna system. Therefore, special tests are used to verify the sensitivity of the AVSWR measurement to adjacent interferers.

Another drawback is that the AVSWR measurement can only be performed over a small bandwidth determined by the configured frequency of the mixer and low pass filter. The AVSWR method cannot measure the $V_{fwd}$ or $V_{refl}$ separately. Any voltage induced on the antenna system due to an interferer will be coupled into both the $V_{fwd}$ and $V_{refl}$ signals, and will impact the accuracy of the measurement. The level of coupling is based on the S-parameters of the directional coupler.

The AVSWR measurement method also does not compare the $V_{fwd}$ or $V_{refl}$ with the original transmitted signal, denoted $V_{ref}$, and thus does not determine if there is any interference that impacts the overall accuracy of the measurement.

SUMMARY

The present invention provides methods and apparatus to detect the presence of interferers in a wideband digital VSWR measurement signal. Interferers cause power differences over different intervals of time and frequency, and may be detected by comparing the measured signals in both time and frequency domains with the original signal. Frequency components in the measured signals may be discarded if the interference is deemed too large. The remaining frequency components can then be used to compute the VSWR.

Exemplary embodiments of the invention comprise methods of measuring the VSWR in a wideband communication system. In one exemplary embodiment, time-domain measurement signals for a forward wave and a reflected wave are converted to a frequency domain. Reflection coefficients are then computed for a plurality of frequency components in the measurement signals. The reflection coefficients are used to compute interference detection metrics for one or more of the frequency components in the measurement signals. Frequency components in the forward wave, the reflected wave, or both, may be discarded based on the interference detection metrics, and the the remaining frequency components in the forward and reflected waves are used to compute the VSWR.

Other embodiments of the invention comprise a wireless terminal configured to compute a VSWR. The wireless terminal comprises a directional coupler connected between a transmitter and an antenna, a receiver circuit to generate time domain measurement signals for forward and reflected waves, and a processing circuit for computing the VSWR. The processing circuit is configured to convert time-domain measurement signals for the forward wave and the reflected wave to a frequency domain; compute reflection coefficients for a plurality of frequency components in the measurement signals as a function of the reflection coefficients, compute interference detection metrics for one or more of the frequency components in the measurement signals, discard one or more frequency components in the forward wave or the reflected wave, or both, based on the interference detection metrics, and compute a VSWR for the forward wave and the reflected wave based on the remaining frequencies in the forward and reflected waves.

The present invention enables the detection of an interfering signal in measurement signals used to compute the VSWR. As a result, elements in the measurement signals containing interference may be discarded before the VSWR is computed. False alarms can be avoided, resulting in fewer service calls and network outages.

DETAILED DESCRIPTION

Figure 1:
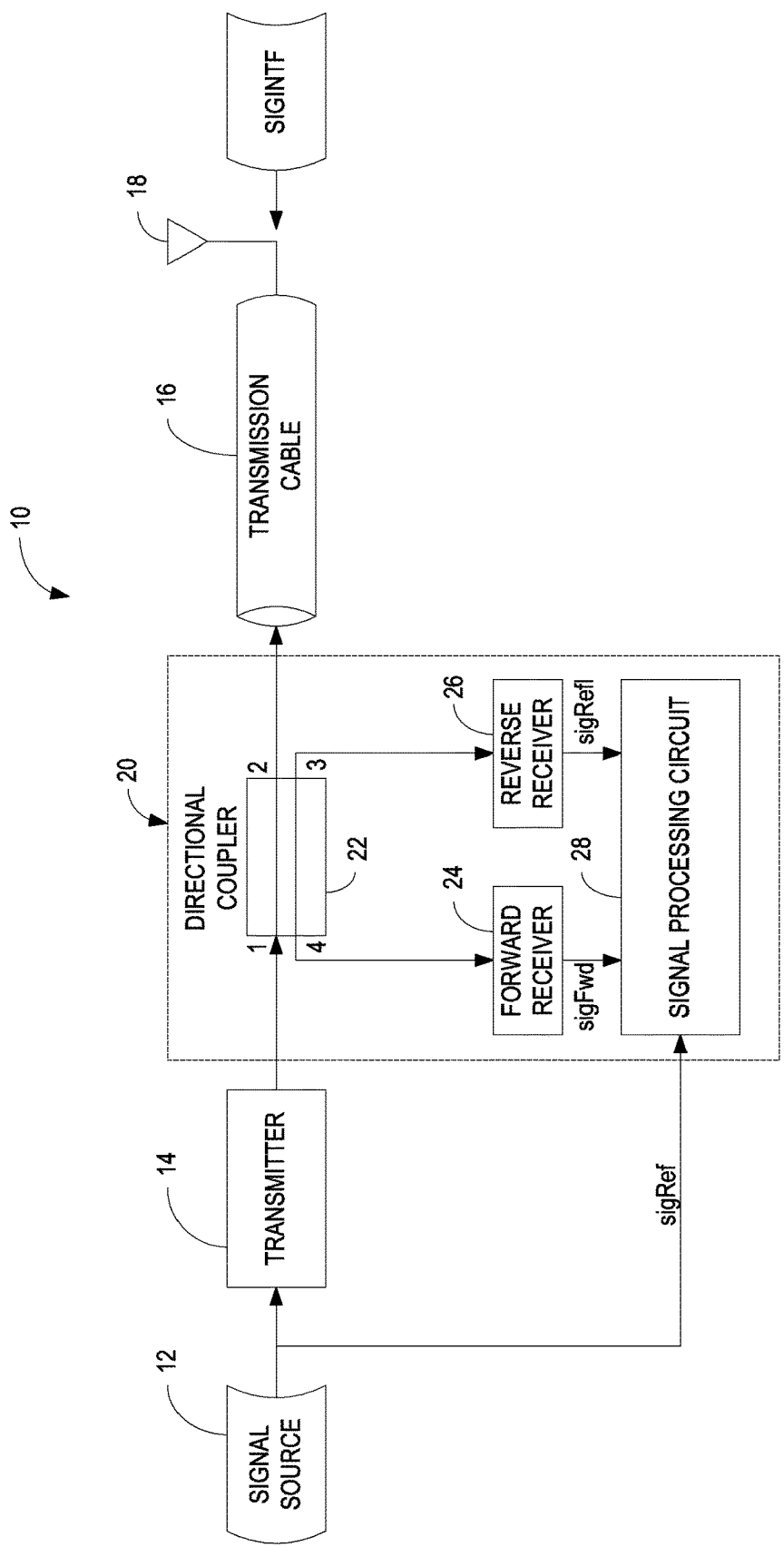
FIG. 1 illustrates a wireless terminal including a measurement circuit for measuring the voltage standing wave ratio (VSWR) of the antenna system.

FIG. 1 illustrates an exemplary wireless terminal 10 including a measurement circuit 20 for determining a voltage standing wave ratio (VSWR). A signal source 12 generates a digital signal for transmission over a wireless channel. The digital signal is applied to the input of a transmitter 14. After conversion to analog form, the transmitter 14 upconverts, filters, and amplifies the signal. The output of the transmitter 14 is coupled via a transmission cable 16 to a transmit antenna 18. A measurement circuit 20 is coupled to the transmission cable 18 between the transmitter 14 and antenna 18 to measure the voltage standing wave ratio (VSWR) of the antenna system. As will be hereinafter described in greater detail, the measurement circuit 20 is configured to detect interferers in the signals on which measurements are made, and to remove frequency components of the measurement signals containing excessive interference.

The measurement circuit 20 includes a directional coupler 22, forward receiver 24, a reverse receiver 26, and a signal processing circuit 28. The directional coupler 22 generates scaled versions of the transmitted signal, i.e the forward signal, and reflected signal. An interfering signal may be coupled by the directional coupler 22 into both the forward and reflected signals. The forward receiver 24 receives the scaled version of the transmit signal, referred to as the forward measurement signal (sigFwd). The forward receiver 24 demodulates and digitizes the forward measurement signal. The reverse receiver 26 receives a scaled version of the reflected signal, referred to as the reflected measurement signal (sigRefl). The reverse receiver 26 demodulates and digitizes the reflected measurement signal. The digitized measurement signals are input to the signal processing circuit 28. Additionally, the original signal is applied to the signal processing circuit 28 and used as a reference signal (sigRef).

The signal processing circuit 28 has two main functions. First, the signal processing circuit 28 detects the presence of interfering signals within or adjacent to the measurement bandwidth. As described in greater detail below, interfering signals may be detected by comparing the measurement signals with the original transmitted or reference signal in both the time and frequency domain. Second, the signal processing circuit 28 calculates the VSWR of the antenna system based on the measurement signals. For purposes of calculating the VSWR, frequency components in the measurement signals corrupted by interference are discarded.

Figure 2:
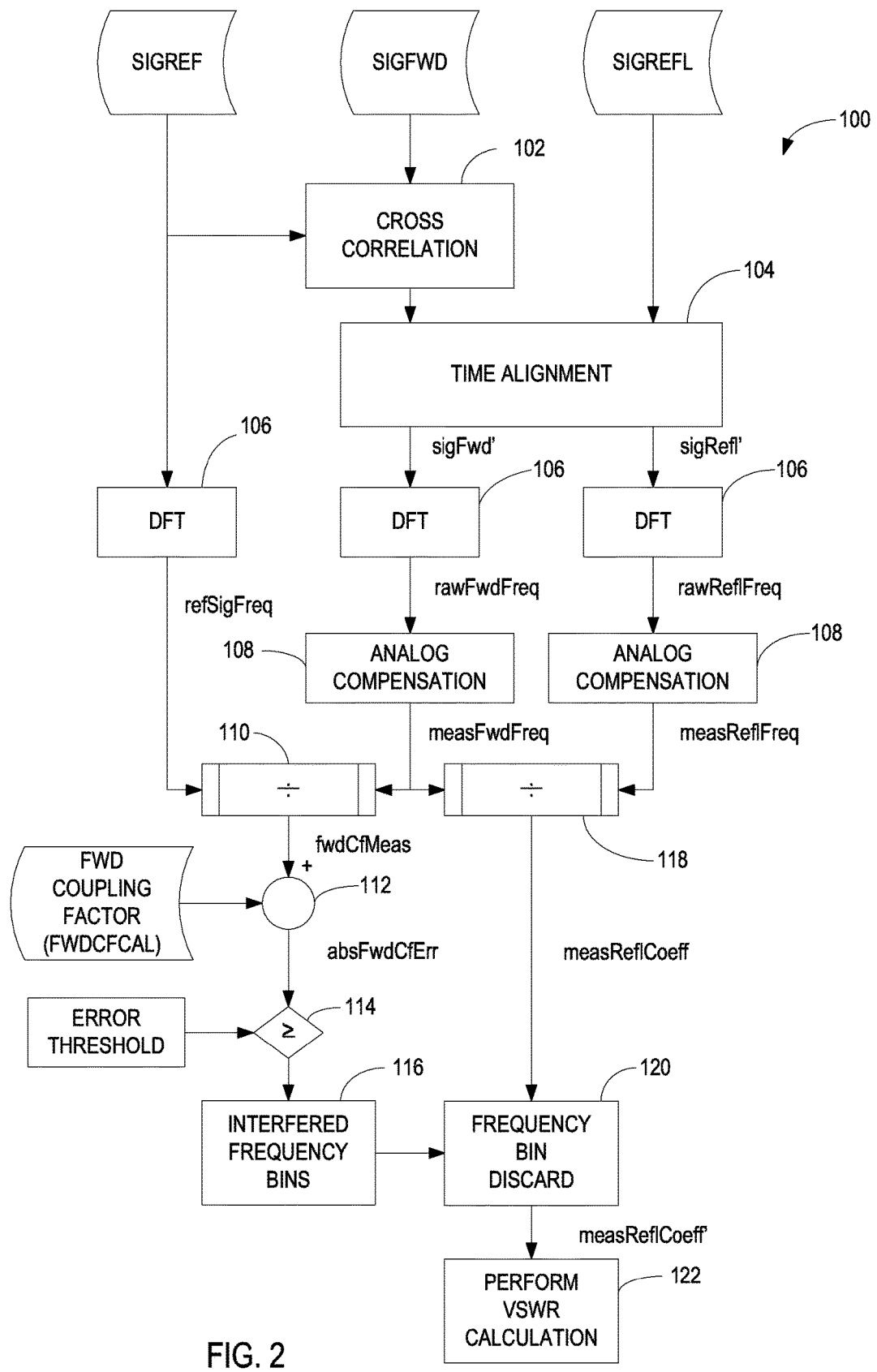
FIG. 2 illustrates exemplary processing for computing the VSWR according to one exemplary embodiment.

FIG. 2 illustrates exemplary processing steps 100 performed by the signal processing circuit 28 in one embodiment. The inputs to the signal processing circuit 28 include sigRef, sigFwd, and sigRefL. The signals sigRef, sigFwd, and sigRefL are sampled over a finite period of time. The measurement signals sigFwd and sigRefL may be sampled as RF signals and converted to the digital domain. The reference signal (sigRef) may comprise a baseband signal, or may be sampled as an analog RF signal in a manner similar to sigFwd and sigRefL.

The signal processing circuit 28 cross correlates sigFwd with sigRef to find the peak correlation and determine the sample offset (block 102). Once the sample offset is known, the signal processing circuit 28 time-aligns sigFwd and sigRefL with sigRef (block 104). The signal processing circuit 28 then performs a Discrete Fourier Transform (DFT) or other transform operation to convert the time-aligned signals (sigRef, sigFwd', sigRefl') from the time domain to the frequency domain (block 106). The frequency domain signals (refSigFreq, rawFwdFreq, and rawReflFreq) represent the magnitude and the phase of the signals with respect to frequency. The signal processing circuit 28 compensates rawFwdFreq and rawReflFreq for nonlinearities in the analog circuits by applying calibration factors determined during radio calibration procedures (block 108). The signals output from the analog compensation function are the measured forward frequency (measFwdFreq) and measured reflected frequency (measReflFreq).

Figure 5:
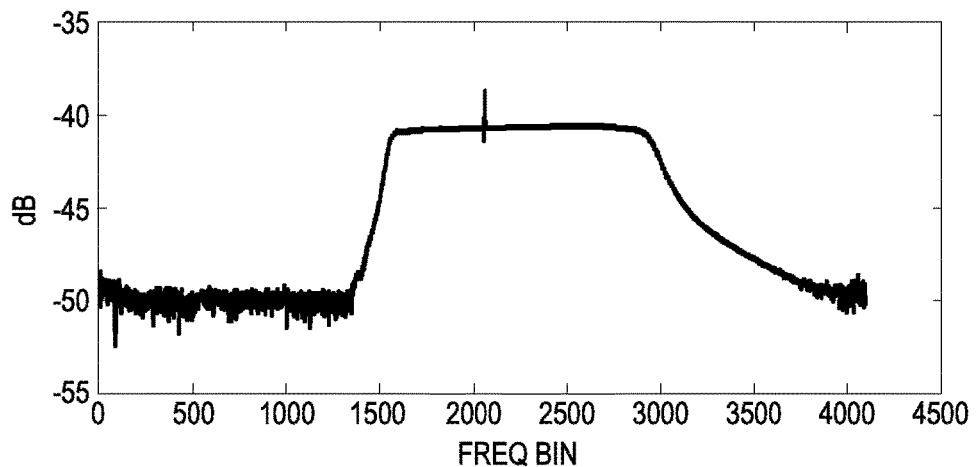
FIG. 5 is an exemplary graph of the measured coupling factor showing an interfering signal.
Figure 6:
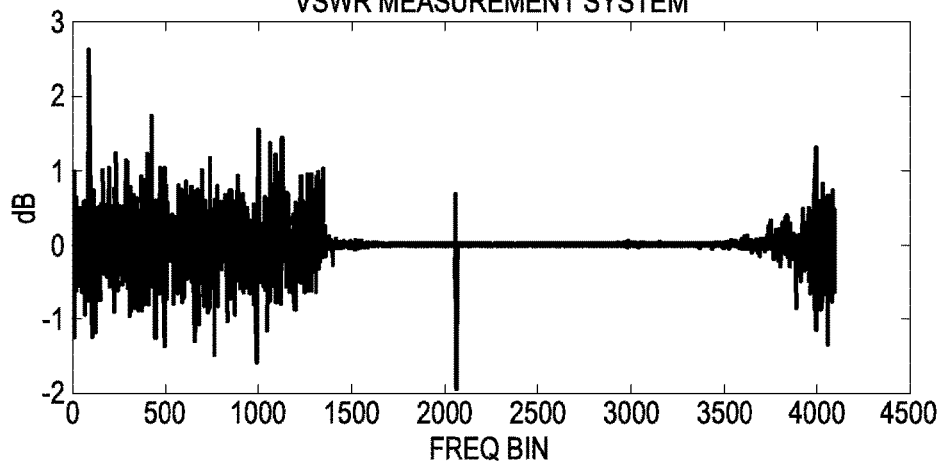
FIG. 6 is an exemplary graph of the forward coupling factor error showing an interfering signal.

The signal processing circuit 28 calculates a measured forward coupling factor, (fwdCfMeas) for each of a plurality of frequency bins (block 110). The forward coupling factor for a given frequency bin is equal to the measured forward frequency divided by the reference signal frequency (measFwdFreq/refSigFreq). FIG. 5 shows a graph of the forward coupling factor for a white noise reference signal with a GSM interferer. The measured forward coupling factor (fwdCfMeas) is compared against the known coupling factor (fwdCfCal) determined at the time of calibration. The difference between the measured forward coupling factor and the calibrated coupling factor is computed to obtain an absolute forward coupling factor error (absFwdCf Err) (block 112). FIG. 6 shows a graph of the forward coupling factor error for a white noise reference signal with a GSM interferer.

The forward coupling factor error is used as an interference detection metric. A high forward coupling factor error indicates the presence of an interfering signal. Therefore, the forward coupling factor error computed for each frequency bin can be compared to an error threshold (block 114). If the forward coupling factor error is greater than or equal to the error threshold, it is determined that interference is present in the corresponding frequency bin (block 116).

The signal processing circuit 28 also computes a measured reflection coefficient (measReflCoeff) for each frequency bin. The measured reflection coefficient is computed by dividing the measured forward frequency by the measured reflected frequency (measFwdFreq/measReflFreq). The measured reflection coefficients for frequency bins where interference is present are then discarded (block 120). The measured reflection coefficient for the remaining frequency bins are used to compute the VSWR (block 122). The VSWR is given by:

$$VSWR = \frac{V_{max}}{V_{min}} = \frac{1+\rho}{1-\rho}$$

where $\rho=|\Gamma|$ and $\Gamma$ is the measured reflection coefficient.

Figure 3:
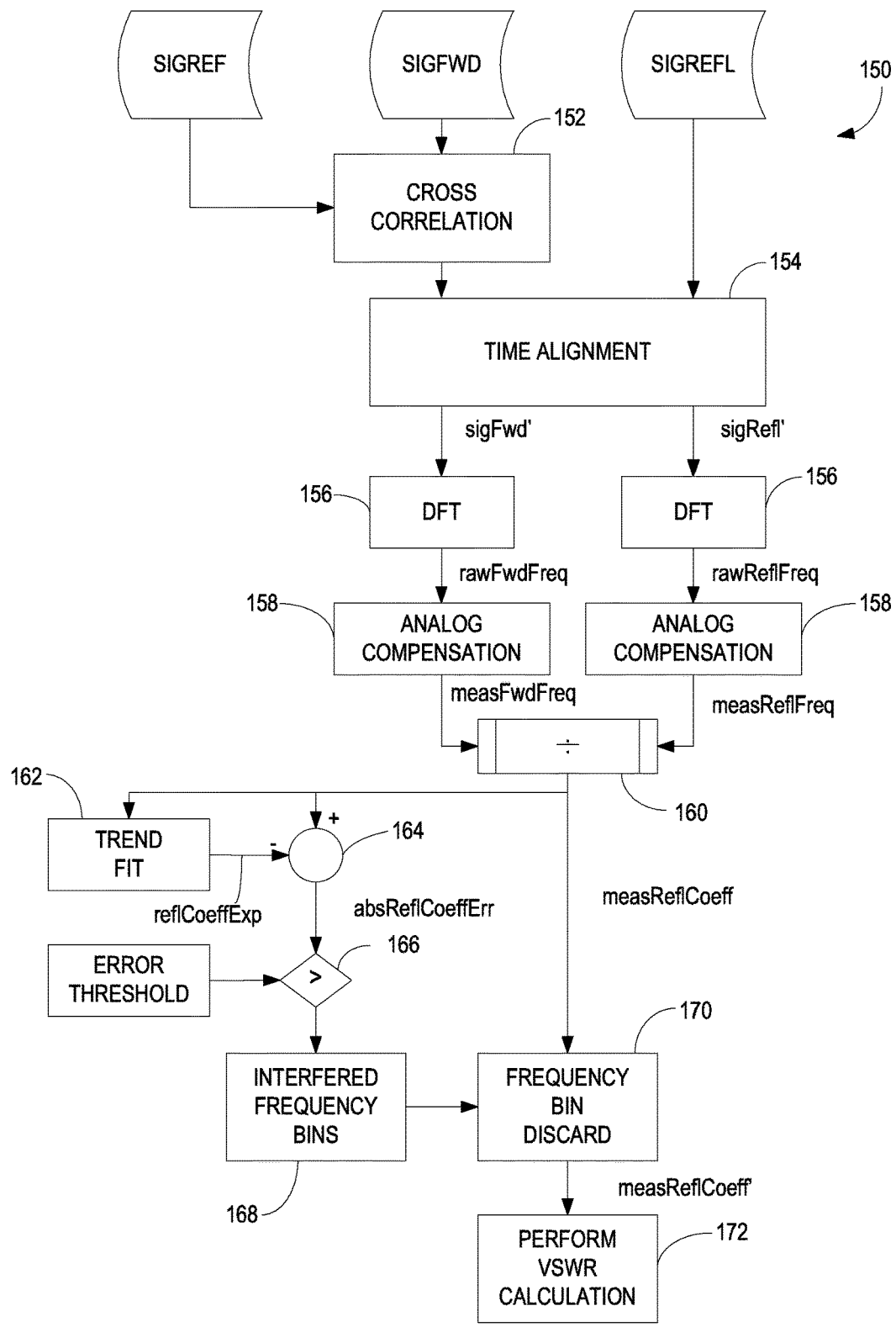
FIG. 3 illustrates exemplary processing for computing the VSWR according to a second exemplary embodiment.

FIG. 3 illustrates exemplary processing steps 150 performed by the signal processing circuit 28 in another exemplary embodiment. In this embodiment, the measured reflection coefficient is compared to an expected reflection coefficient to detect the presence of interfering signals in the measurement signals. The frequency components containing interference are discarded and the VSWR is calculated based on the remaining frequency components.

The signal processing circuit 28 cross-correlates the forward signal with the reference signal to determine a sample offset (block 152). The sample offset determined by the cross-correlation is used to time align the forward signal and reflected signal (block 154). The time-aligned signals (sigFwd', sigRefl') are then converted from the time domain to the frequency domain by a DFT operation (block 156). Analog compensation is applied to the raw frequency domain signals (rawFwdFreq and rawReflFreq) as previously described to obtain a measured forward frequency (measFwdFreq) and measured reflected frequency (measReflFreq)(block 158).

A measured reflection coefficient (measReflCoeff) is computed by dividing the measured forward frequency by the measured reflected frequency (block 160). The measured reflected coefficient is input to a trend-fitting algorithm to obtain an expected reflection coefficient (reflCoeffExp) (block 162). The signal processing circuit 28 determines a difference between the measured reflected coefficient and the expected reflected coefficient (block 164). This difference represents the absolute reflection coefficient error (absReflCoeffErr). Because interfering signals will result in a detectable error in the reflection coefficient over the bandwidth of the measured signals, the reflection coefficient error can be used as an interference detection metric.

The reflection coefficient error is compared to an error threshold (block 166). If the reflection coefficient error exceeds the error threshold, it is determined that the corresponding frequency component contains an interfering signal (block 168). The frequency components containing the interfering signals are discarded (block 170). The measured reflection coefficients for the remaining frequency components are used to compute the VSWR as previously described (block 172).

Figure 4:
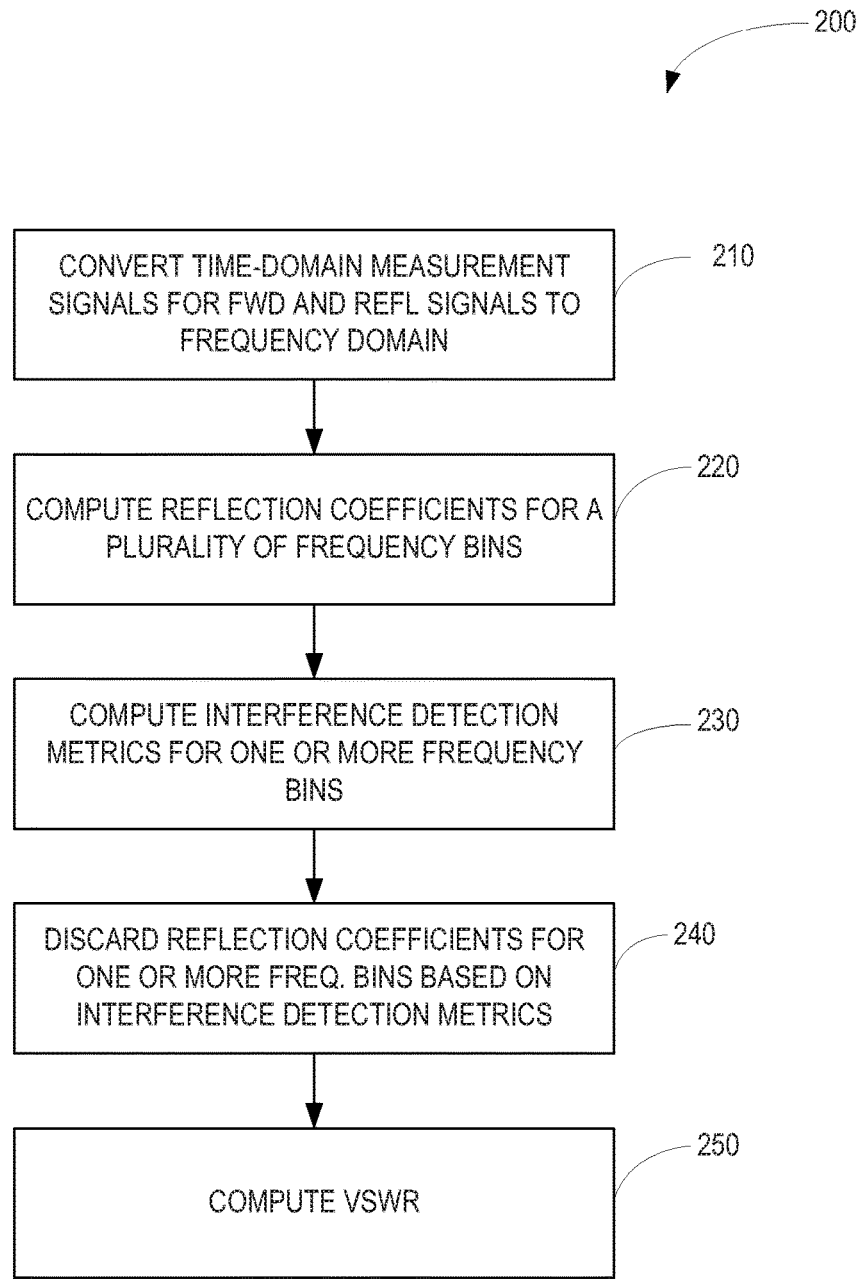
FIG. 4 illustrates an exemplary method of computing a VSWR for an antenna system.

FIG. 4 illustrates a general method 200 performed by the signal processing circuit 28 to compute the VSWR. The signal processing circuit 28 converts time domain and measurement signals to the frequency domain (block 210). As previously noted, the frequency domain representation represents the magnitude and phase as a function of frequency. The bandwidth is divided into a plurality of frequency bins. The signal processing circuit 28 computes reflection coefficients for each of the frequency bins (block 220). The signal processing circuit 28 also computes an interference detection metric for each frequency bin (block 230). In the embodiment shown in FIG. 2, the interference detection metric comprises the forward coupling factor error. In the embodiment shown in FIG. 3, the interference detection metric comprises the reflection coefficient error. Based on the interference detection metric, the signal processing circuit 28 discards frequency components in the measurement signals corresponding to frequency bins where the interfering signal is detected (block 240). The VSWR is then computed based on the remaining frequency components (block 250).

The techniques described herein enable the detection of an interfering signal in measurement signals used to compute the VSWR. As a result, frequency components in the measurement signals containing interference may be discarded. False alarms can be avoided, resulting in fewer service calls and network outages. Thus, network operators would see a significant savings. In cases where the interfering signal is persistent, the interfering signal can be identified and an appropriate response can be sent to the operator (alarms, warnings, or other corrective action).

Thus, the foregoing description and the accompanying drawings represent non-limiting examples of the methods and apparatus taught herein. As such, the present invention is not limited by the foregoing description and accompanying drawings. Instead, the present invention is limited only by the following claims and their legal equivalents.

What is claimed is:

1. A measurement circuit for measuring a voltage standing wave ratio (VSWR) in an antenna system, the measurement circuit comprising:
 a directional coupler connected between a transmitter and an antenna;
 a receiver circuit to generate measurement signals for forward and reflected signals in a transmission line of the antenna system; and
 a processing circuit configured to:
  compute reflection coefficients for a plurality of frequency bins based on the measurement signals;
  detect interference in one or more of the frequency bins by computing interference detection metrics for one or more frequency bins among said plurality of frequency bins as a function of the reflection coefficients, wherein the interference detection metrics comprises a forward coupling factor error or a reflection coefficient error, wherein it is determined that a corresponding frequency bin contains an interfering signal if the forward coupling factor error or the reflection coefficient error exceeds an error threshold;
  discard reflection coefficients for one or more frequency bins in which interference has been detected; and
  compute the VSWR of the antenna system based on the reflection coefficients for a remaining number of frequency bins.

2. The measurement circuit of claim 1, wherein the processing circuit is configured to control, based on the computed VSWR, transmission of a signal on the transmission line.

3. The measurement circuit of claim 2, wherein the processing circuit is configured to control by sending a control signal to refrain from transmitting the transmission signal on the transmission line.

4. The measurement circuit of claim 1, wherein the processing circuit is configured to detect a transmission line or antenna fault based on the computed VSWR, and send a control signal for the antenna system responsive to the detection.

5. The measurement circuit of claim 1, wherein:
 the receiver circuit is configured to generate measurement signals by generating time-domain measurement signals; and
 the processing circuit is configured to:
  compute discrete Fourier transforms of the measurement signals for the forward signal and the reflected signal to convert the measurement signals to the frequency domain, and
  compute the reflection coefficients based on the frequency-domain measurement signals.

6. The measurement circuit of claim 1, wherein the processing circuit is configured to divide a magnitude of the measurement signal for the reflected signal by a corresponding magnitude of the measurement signal for the forward signal to compute the reflection coefficients.

7. The measurement circuit of claim 1, wherein, to detect interference in one of more of the frequency bins, the processing circuit is configured to
 compare the interference detection metrics for one or more frequency bins to the error threshold.

8. The measurement circuit of claim 1, wherein the processing circuit is configured to determine measurement errors for each of the frequency bins as a function of its corresponding reflection coefficient, and wherein the measurement errors comprise interference detection metrics for determining interference in one or more of the frequency bins.

9. A method of measuring a voltage standing wave ratio (VSWR) of an antenna system, the method comprising:

generating measurement signals corresponding respectively to a forward signal and a reflected signal in a transmission line of the antenna system;

computing reflection coefficients for a plurality of frequency bins based on the measurement signals;

detecting interference in one or more of the frequency bins by computing interference detection metrics for one or more frequency bins among said plurality of frequency bins as a function of the reflection coefficients, the interference detection metrics comprising a forward coupling factor error or a reflection coefficient error, wherein it is determined that a corresponding frequency bin contains an interfering signal if the forward coupling factor error or the reflection coefficient error exceeds an error threshold;

discarding reflection coefficients for one or more frequency bins in which interference has been detected; and computing the VSWR of the antenna system based on the reflection coefficients for a remaining number of frequency bins.

10. The method of claim 9, wherein the method is implemented by a wireless terminal comprising the antenna system, and wherein the wireless terminal computes the VSWR to control a transmitter of the wireless terminal.

11. The method of claim 10, wherein the method comprises controlling, based on the computed VSWR, transmission of a signal on the transmission line, wherein the controlling comprises refraining from transmitting the transmission signal on the transmission line.

12. The method of claim 10, wherein the method comprises detecting a transmission line or antenna fault based on the computed VSWR, and sending a control signal to refrain from transmitting a transmission signal on the transmission line.

13. The method of claim 9, wherein:
the generating measurement signals comprises generating time-domain measurement signals;
the method comprises computing discrete Fourier transforms of the measurement signals for the forward signal and the reflected signal to convert the measurement signals to the frequency domain; and
computing the reflection coefficients based on the frequency-domain measurement signals.

14. The method of claim 9, wherein computing reflection coefficients for a plurality of frequency bins based on the reflection coefficients comprises dividing a magnitude of the measurement signal for the reflected signal by a corresponding magnitude of the measurement signal for the forward signal.

15. The method of claim 9, wherein detecting interference in one or more frequency bins based on the interference detection metrics comprises
comparing the interference detection metrics for one or more frequency bins to the error threshold.

16. The method of claim 9, wherein computing interference detection metrics for one or more of the frequency bins comprises computing measurement errors for each of the frequency bins as a function of its corresponding reflection coefficient, and wherein the measurement errors comprise the interference detection metrics.

17. The method of claim 16, wherein discarding frequency bins comprises discarding frequency bins where the measurement error satisfies an error threshold.

18. The method of claim 16, wherein computing measurement errors for each of the frequency bins as a function of its corresponding reflection coefficient comprises:
computing a forward coupling factor for each frequency bin as a function of the measurement signal for the forward signal and a reference signal; and
computing the measurement error as a function of the difference between the forward coupling factor and a reference value.

19. The method of claim 16, wherein computing measurement errors for each of the frequency bins as a function of its corresponding reflection coefficient comprises computing the measurement error based on a difference between the computed reflection coefficient and an expected reflection coefficient.

* * * * *